United States Patent
Okumura et al.

(10) Patent No.: US 11,508,507 B2
(45) Date of Patent: Nov. 22, 2022

(54) MAGNETIC WIRING CIRCUIT BOARD AND PRODUCING METHOD THEREOF

(71) Applicant: NITTO DENKO CORPORATION, Osaka (JP)

(72) Inventors: Keisuke Okumura, Osaka (JP); Yoshihiro Furukawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/980,614

(22) PCT Filed: Oct. 19, 2018

(86) PCT No.: PCT/JP2018/039082
§ 371 (c)(1),
(2) Date: Sep. 14, 2020

(87) PCT Pub. No.: WO2019/176152
PCT Pub. Date: Sep. 19, 2019

(65) Prior Publication Data
US 2021/0249171 A1    Aug. 12, 2021

(30) Foreign Application Priority Data

Mar. 16, 2018    (JP) .............................. JP2018-049135

(51) Int. Cl.
*H01F 17/00*    (2006.01)
*H02J 50/10*    (2016.01)
(Continued)

(52) U.S. Cl.
CPC ......... *H01F 17/0006* (2013.01); *H01F 38/14* (2013.01); *H01F 41/041* (2013.01);
(Continued)

(58) Field of Classification Search
CPC .... H01F 17/0006; H01F 38/14; H01F 41/041; H01F 2017/0066; H05K 1/165; H02J 50/10
See application file for complete search history.

(56) References Cited

U.S. PATENT DOCUMENTS

| 6,048,601 A | 4/2000 | Yahagi et al. |
| 2004/0103808 A1* | 6/2004 | Lochun ................ H05K 3/1275 101/483 |

(Continued)

FOREIGN PATENT DOCUMENTS

| CN | 1197988 A | 11/1998 |
| CN | 1983473 A | 6/2007 |

(Continued)

OTHER PUBLICATIONS

International Search Report Issued in PCT/JP2018/039082 dated Jan. 22, 2019.

(Continued)

*Primary Examiner* — William H. Mayo, III
*Assistant Examiner* — Rhadames Alonzo Miller
(74) *Attorney, Agent, or Firm* — Edwards Neils LLC; Jean C. Edwards, Esq.

(57) ABSTRACT

A magnetic wiring circuit board includes an insulating layer; a wire disposed on a one-side surface in a thickness direction of the insulating layer and having a one-side surface in the thickness direction disposed to face the one-side surface in the thickness direction of the insulting layer at spaced intervals thereto, an other-side surface in the thickness direction in contact with the one-side surface in the thickness direction of the insulating layer, and side surfaces each connecting an end edge of the one-side surface in the thickness direction to an end edge of the other-side surface in the thickness direction; and a magnetic layer containing a (Continued)

magnetic particle having a shape of an aspect ratio of 2 or more and embedding the wire.

16 Claims, 8 Drawing Sheets

(51) Int. Cl.
*H01F 38/14* (2006.01)
*H01F 41/04* (2006.01)
*H05K 1/16* (2006.01)

(52) U.S. Cl.
CPC .............. *H02J 50/10* (2016.02); *H05K 1/165* (2013.01); *H01F 2017/0066* (2013.01)

(56) References Cited

U.S. PATENT DOCUMENTS

| | | | |
|---|---|---|---|
| 2004/0164730 A1* | 8/2004 | Schroeder | H01F 41/26 324/207.22 |
| 2004/0164835 A1* | 8/2004 | Shoji | H01F 17/0013 336/200 |
| 2005/0174209 A1* | 8/2005 | Teshima | H01F 5/003 336/200 |
| 2006/0118905 A1* | 6/2006 | Himori | H05K 3/24 438/678 |
| 2007/0146109 A1 | 6/2007 | Nogi | |
| 2009/0002117 A1* | 1/2009 | Kawarai | H01F 17/04 336/233 |
| 2013/0249662 A1 | 9/2013 | Tonoyama et al. | |
| 2014/0285305 A1 | 9/2014 | Yoo et al. | |
| 2015/0201499 A1* | 7/2015 | Shinar | B29C 64/135 425/132 |
| 2015/0201500 A1* | 7/2015 | Shinar | B29C 64/135 425/132 |
| 2015/0340149 A1* | 11/2015 | Lee | H05K 1/181 174/260 |
| 2016/0105969 A1* | 4/2016 | Habu | H05K 1/165 156/285 |
| 2016/0172086 A1* | 6/2016 | Habu | G06F 3/046 428/206 |
| 2016/0211061 A1* | 7/2016 | Masuda | H01F 5/00 |
| 2016/0218057 A1* | 7/2016 | Lee | H01L 21/486 |
| 2016/0233027 A1 | 8/2016 | Iijima et al. | |
| 2016/0343498 A1* | 11/2016 | Lee | H01G 4/248 |
| 2016/0372259 A1* | 12/2016 | Banba | H01F 17/062 |
| 2017/0025220 A1* | 1/2017 | Nakaniwa | H01F 17/0013 |
| 2017/0135206 A1* | 5/2017 | Ueda | H05K 1/05 |
| 2018/0054900 A1* | 2/2018 | Ueda | H01F 41/043 |
| 2018/0091902 A1* | 3/2018 | Salvatti | H04R 9/045 |
| 2018/0366246 A1* | 12/2018 | Park | H01F 27/29 |
| 2019/0035528 A1* | 1/2019 | Choi | H01F 27/32 |
| 2019/0035535 A1* | 1/2019 | Furukawa | H02J 50/10 |
| 2019/0051446 A1* | 2/2019 | Park | H01F 27/2804 |
| 2019/0074127 A1* | 3/2019 | Ito | H01F 17/0013 |
| 2019/0082542 A1* | 3/2019 | Yosui | H01F 27/292 |
| 2019/0261093 A1* | 8/2019 | Salvatti | H04R 1/06 |
| 2019/0318854 A1 | 10/2019 | Park et al. | |

FOREIGN PATENT DOCUMENTS

| | | |
|---|---|---|
| CN | 103366919 A | 10/2013 |
| CN | 105679535 A | 6/2016 |
| JP | 06-120065 A | 4/1994 |
| JP | 2009-009985 A | 1/2009 |
| JP | 2009-117721 A | 5/2009 |
| JP | 2010-267891 A | 11/2010 |
| JP | 2013-183009 A | 9/2013 |
| JP | 2015-092543 A | 5/2015 |
| JP | 2017-005115 A | 1/2017 |
| KR | 10-2017-0060577 A | 6/2017 |
| TW | 201804487 A | 2/2018 |
| WO | 2017/090950 A1 | 6/2017 |

OTHER PUBLICATIONS

Written Opinion Issued in PCT/JP2018/039082 dated Jan. 22, 2019.
International Preliminary Report on Patentability issued by WIPO dated Sep. 22, 2020, in connection with International Patent Application No. PCT/JP2018/039082.
European Search Report issued by the European Patent Office dated Nov. 18, 2021, in connection with European Patent Application No. 18909811.4.
Office Action, issued by the State Intellectual Property Office dated Nov. 5, 2021, in connection with Chinese Patent Application No. 201880090930.7.
Office Action, issued by the Japanese Patent Office dated Dec. 7, 2021, in connection with Japanese Patent Application No. 2018-049135.
Office Action, issued by the Taiwanese Patent Office dated Mar. 18, 2022, in connection with Taiwanese Patent Application No. 107137340.
Office Action, issued by the Japanese Patent Office dated Aug. 30, 2022, in connection with Japanese Patent Application No. 2018-049135.

* cited by examiner

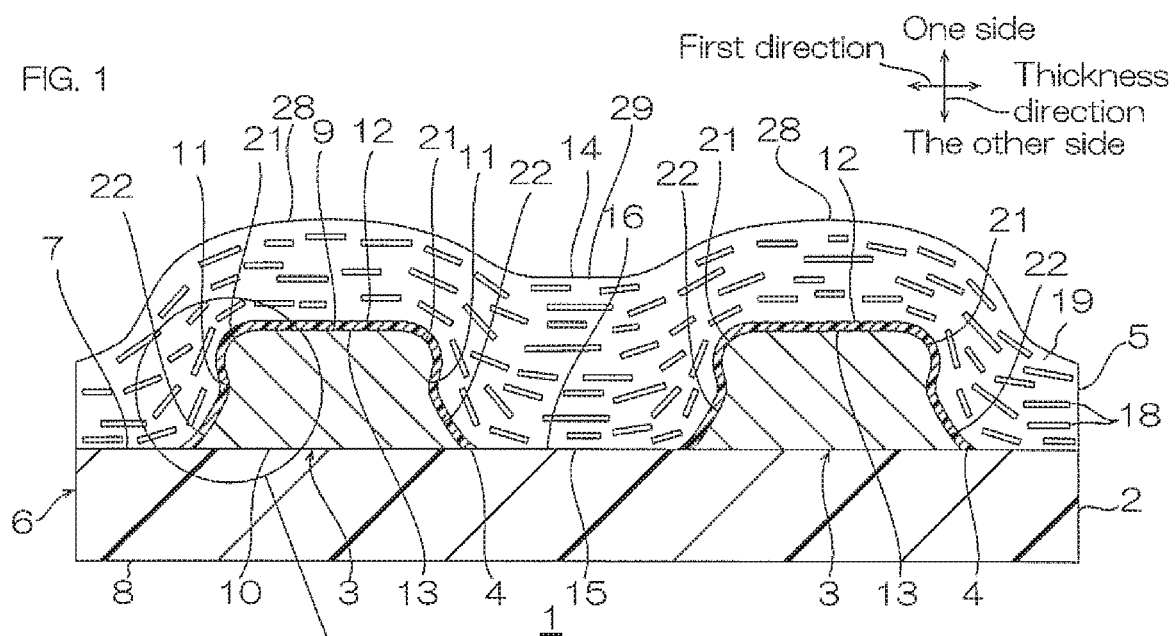
FIG. 1
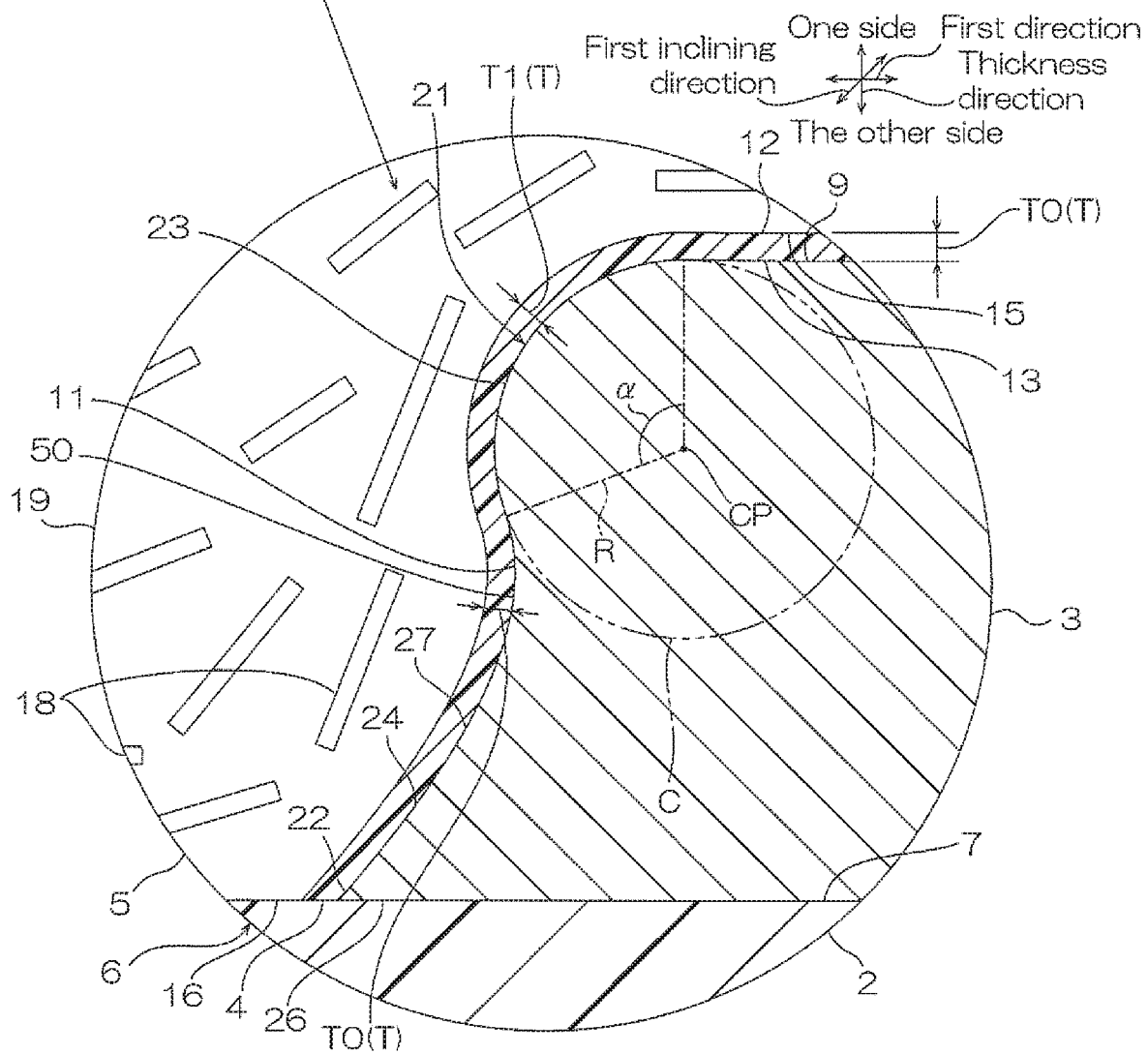

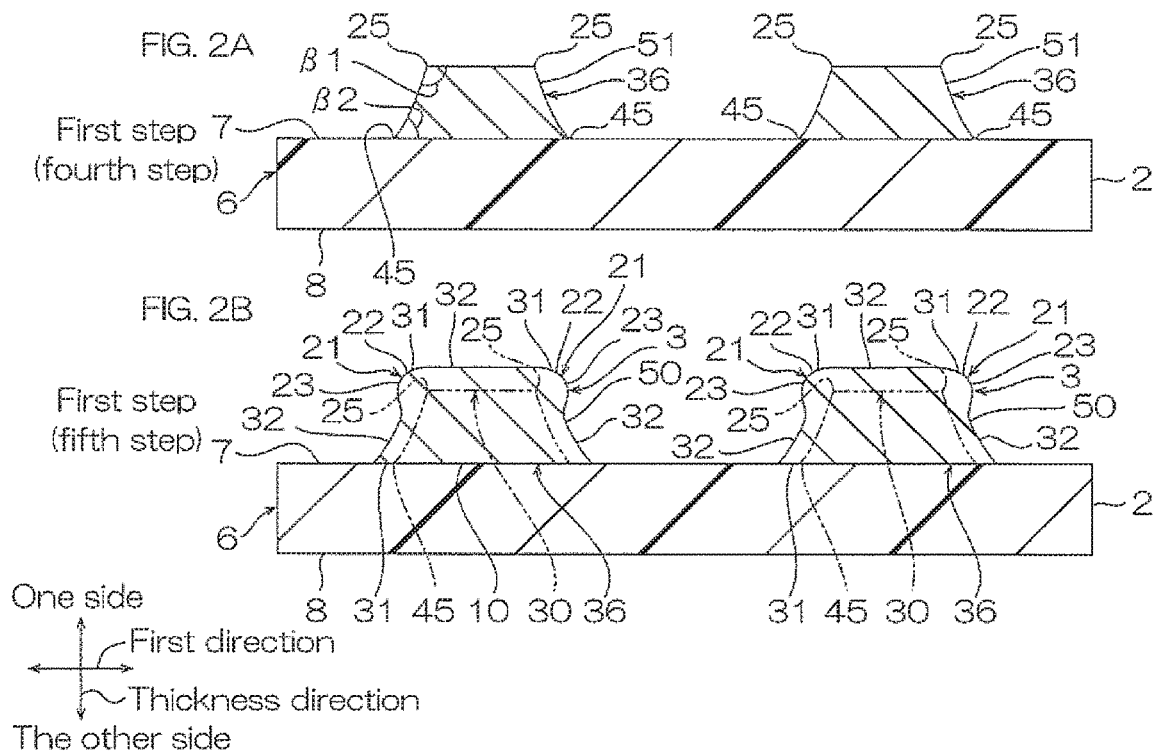
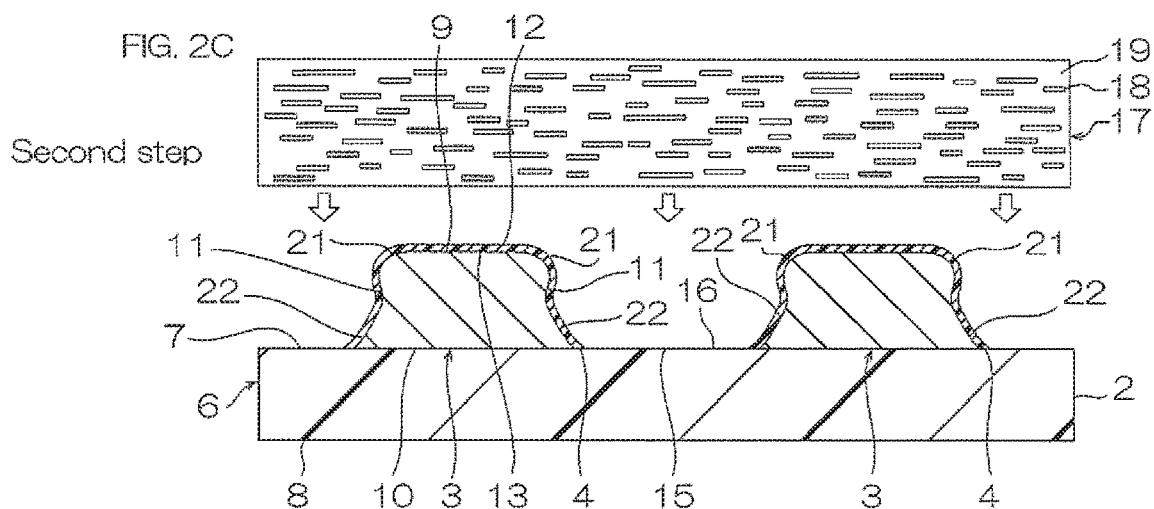
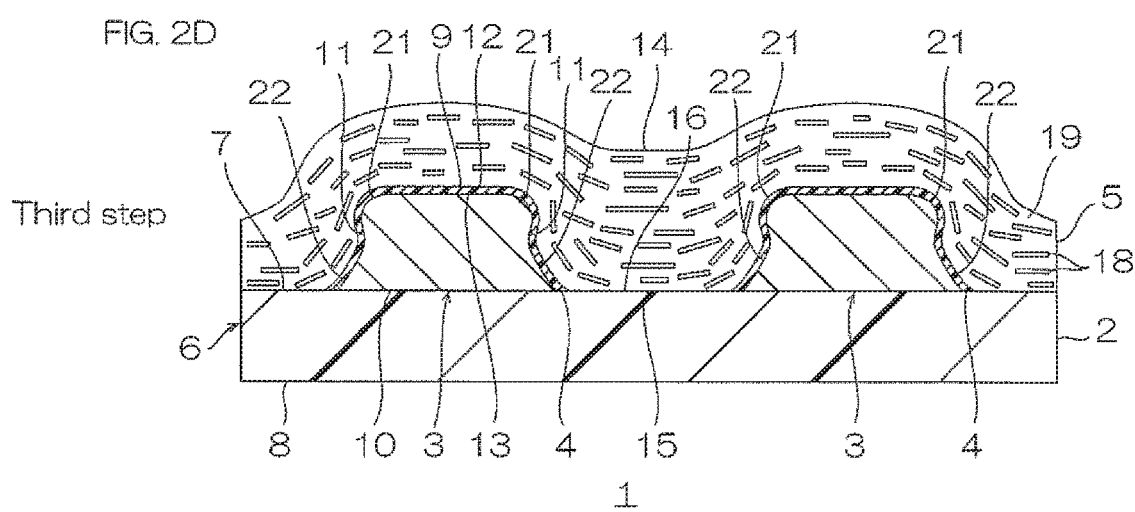

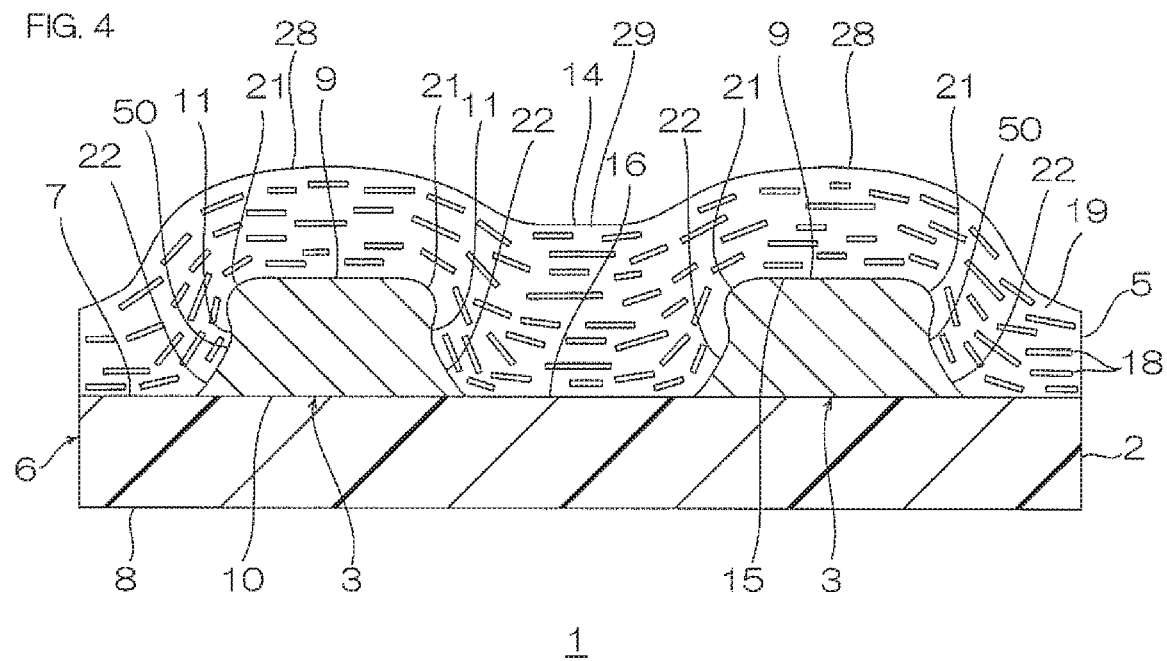
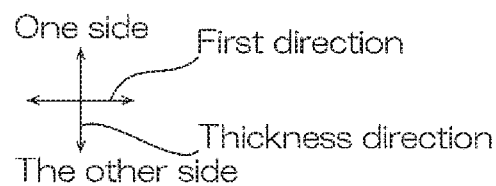
FIG. 4

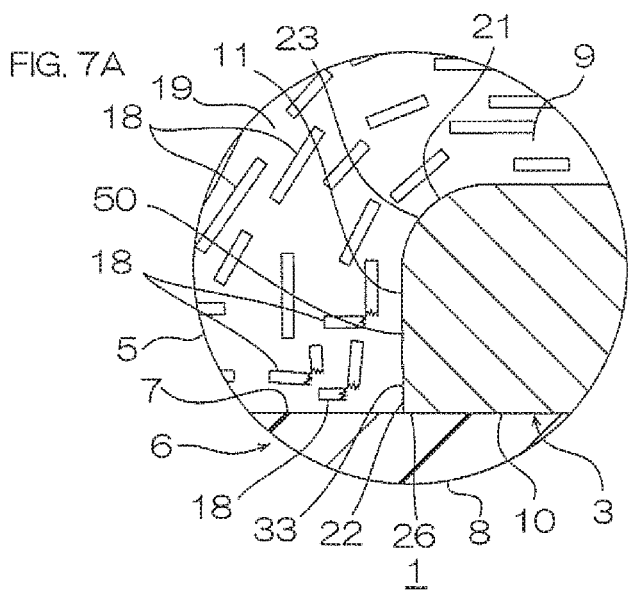
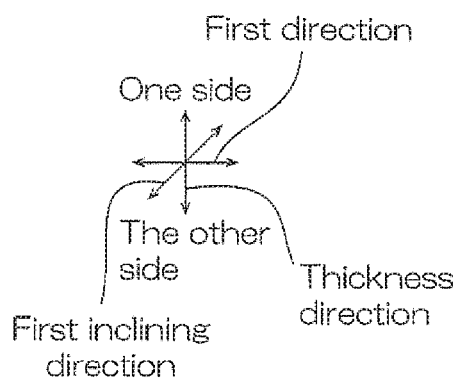
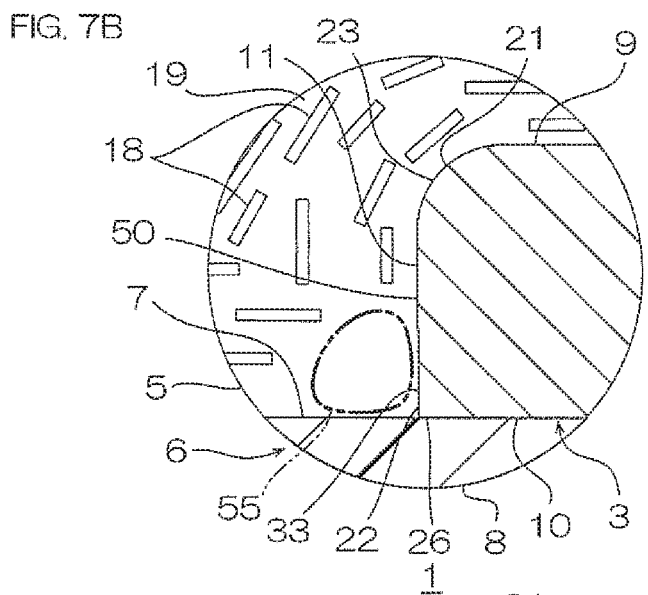
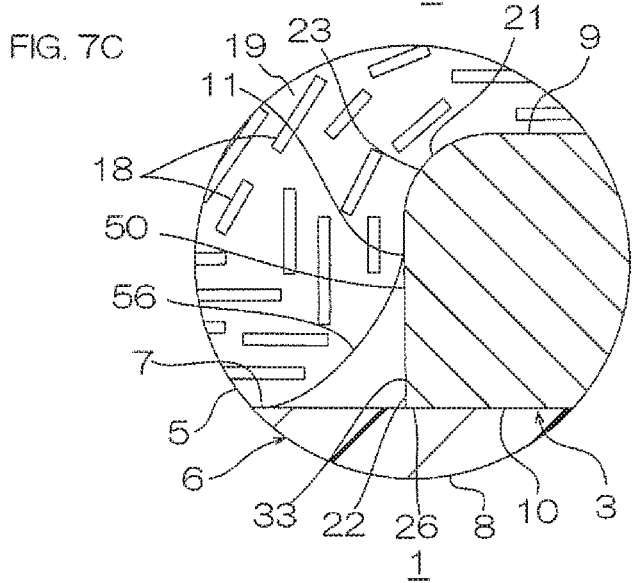

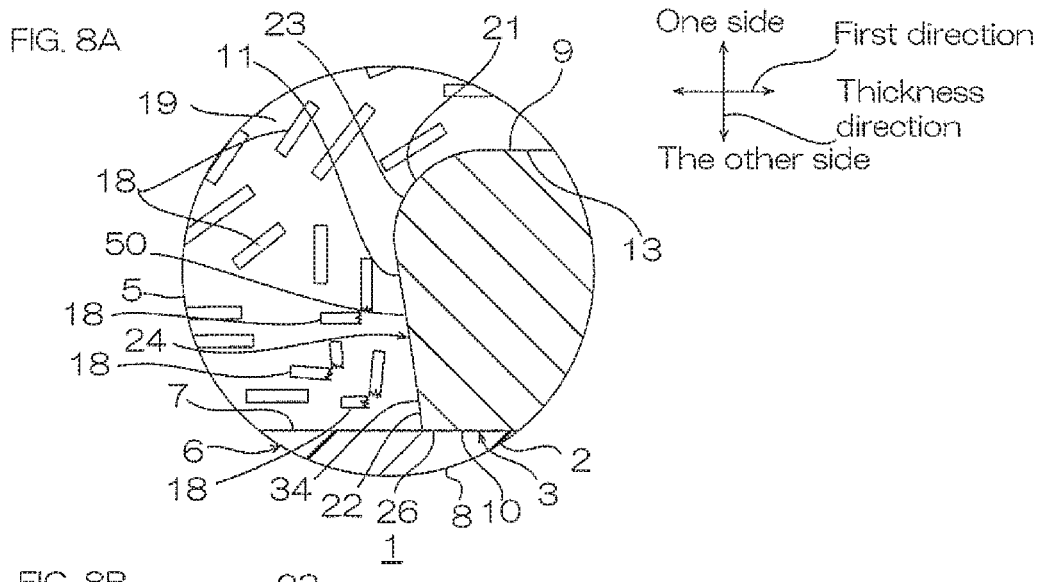
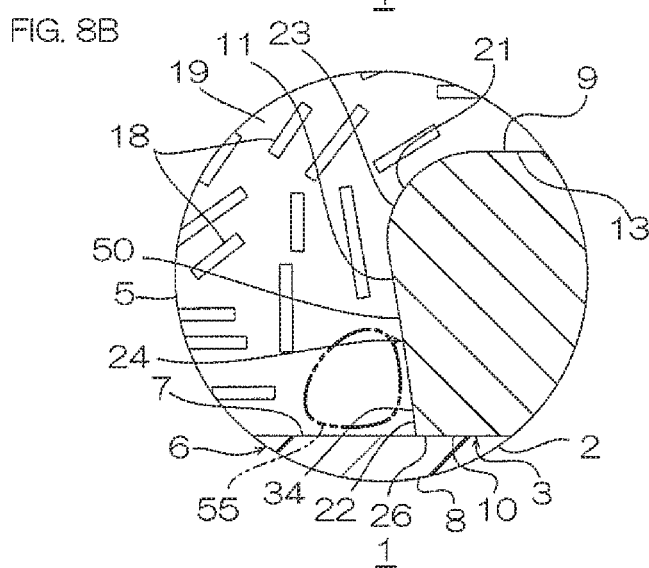
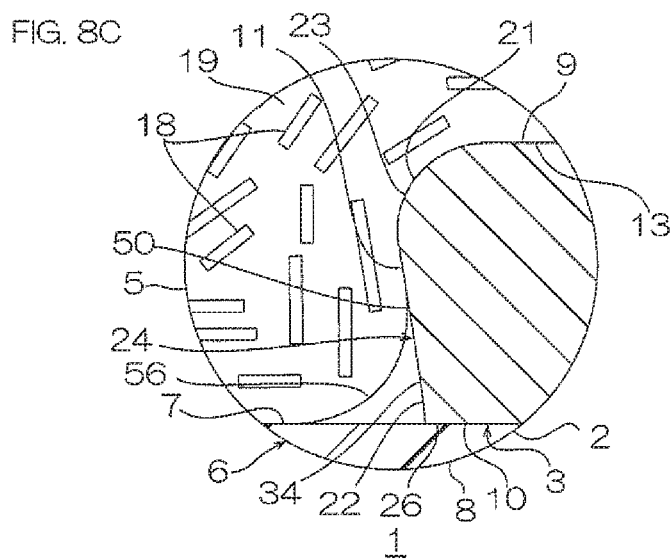

MAGNETIC WIRING CIRCUIT BOARD AND PRODUCING METHOD THEREOF

CROSS-REFERENCE TO RELATED APPLICATIONS

The present application is a 35 U.S.C. 371 National Stage Entry of PCT/JP2018/039082, filed on Oct. 19, 2018, which claims priority from Japanese Patent Application No. 2018-049135, filed on Mar. 16, 2018, the contents of all of which are herein incorporated by reference in their entirety.

TECHNICAL FIELD

The present invention relates to a magnetic wiring circuit board and a producing method thereof.

BACKGROUND ART

Conventionally, it has been known that a coil module is used for wireless communication and, wireless power transmission in which an electric power is wirelessly transmitted.

For example, a coil module including a coil pattern, and a magnetic layer that embeds the coil pattern therein and contains magnetic particles shaped flat has been proposed (ref: for example, the following Patent Document 1).

The coil module is, for example, obtained by first forming the coil pattern by conductor patterning and next, thermally pressing a magnetic sheet containing the magnetic particles with respect to the coil pattern.

CITATION LIST

Patent Document

Patent Document 1: Japanese Unexamined Patent Publication No. 2017-005115

SUMMARY OF THE INVENTION

Problem to be Solved by the Invention

The coil module is required to have high inductance.

However, each ridge portion at a right angle is formed on the upper surface, the side surfaces, and the lower surface of the above-described coil pattern, so that when the magnetic sheet is thermally pressed with respect to the coil pattern, the magnetic particles are only orientated in a thickness direction or plane direction in the magnetic sheet in which the magnetic particles face the ridge portion. Thus, there is a disadvantage that a smooth magnetic path surrounding a wire cannot be formed in the magnetic sheet, and the above-described high inductance cannot be obtained.

The present invention provides a magnetic wiring circuit board having high inductance, and a method for producing a magnetic wiring circuit board.

Means for Solving the Problem

The present invention (1) includes a magnetic wiring circuit board including an insulating layer; a wire disposed on a one-side surface in a thickness direction of the insulating layer and having a one-side surface in the thickness direction disposed to face the one-side surface in the thickness direction of the insulting layer at spaced intervals thereto, an other-side surface in the thickness direction in contact with the one-side surface in the thickness direction of the insulating layer, and side surfaces each connecting an end edge of the one-side surface in the thickness direction to an end edge of the other-side surface in the thickness direction; and a magnetic layer containing a magnetic particle having a shape of an aspect ratio of 2 or more and embedding the wire, wherein the wire has a first corner portion formed by the one-side surface and the side surface in the thickness direction and having a generally curved shape, and a second corner portion formed by the other-side surface and the side surface in the thickness direction and having a portion in which a length between the two side surfaces facing each other becomes longer as it goes toward the other-side surface in the thickness direction.

In the magnetic wiring circuit board, the first corner portion of the wire has the generally curved shape, so that the magnetic particles can be orientated along the curved shape of the first corner portion in the magnetic layer covering the first corner portion.

In the magnetic wiring circuit board, the second corner portion has the portion in which the length between the two side surfaces facing each other becomes longer as it goes toward the other-side surface in the thickness direction, so that the magnetic particles can be orientated along the second corner portion in the magnetic layer covering the second corner portion.

Then, the magnetic particles are orientated in a direction perpendicular to the thickness direction in the magnetic layer covering the one-side surface in the thickness direction of the wire; are orientated in the thickness direction in the magnetic layer covering the side surface of the wire; are orientated in an inclining direction inclining in the thickness direction and the direction perpendicular to the thickness direction in the magnetic layer covering the first corner portion; and are orientated in the inclining direction in the magnetic layer covering the second corner portion.

Thus, a smooth magnetic path surrounding the wire can be formed in the magnetic layer.

Accordingly, an effective magnetic permeability around the wire can be improved.

As a result, the magnetic wiring circuit board has high inductance.

The present invention (2) includes the magnetic wiring circuit board described in (1), wherein a radius of curvature R of the first corner portion is 9 µm or more.

In the magnetic wiring circuit board, the radius of curvature R of the first corner portion is 9 µm or more, so that the first corner portion has a gentle circular arc surface. Thus, the magnetic particles can be furthermore surely orientated along the circular arc surface in the magnetic layer facing the first corner portion.

The present invention (3) includes a method for producing a magnetic wiring circuit board including the steps of preparing an insulating layer; and a wire disposed on a one-side surface in a thickness direction of the insulating layer and having a one-side surface in the thickness direction disposed to face the one-side surface in the thickness direction of the insulting layer at spaced intervals thereto, an other-side surface in the thickness direction in contact with the one-side surface in the thickness direction of the insulating layer, and side surfaces each connecting an end edge of the one-side surface in the thickness direction to an end edge of the other-side surface in the thickness direction and forming a magnetic layer so as to contain a magnetic particle having a shape of an aspect ratio of 2 or more and embed the wire, wherein the wire has a first corner portion formed by the one-side surface and the side surface in the thickness direction and having a generally curved shape, and a second corner portion formed by the other-side surface and the side surface in the thickness direction and having a portion in which a length between the two side surfaces facing each other becomes longer as it goes toward the other-side surface in the thickness direction; and in the step of forming the magnetic layer, a magnetic sheet containing the magnetic particle orientated in a direction perpendicular to the thickness direction is thermally pressed with respect to the wire.

According to the method for producing a magnetic wiring circuit board, in the step of forming the magnetic layer, the magnetic sheet containing the magnetic particles orientated in the direction perpendicular to the thickness direction is thermally pressed with respect to the wire, so that the magnetic particles can be orientated in the direction perpendicular to the thickness direction in the magnetic layer covering the one-side surface in the thickness direction of the wire; can be orientated in the thickness direction in the magnetic layer covering the side surface of the wire; can be orientated in the inclining direction in the magnetic layer covering the first corner portion; and can be orientated in the inclining direction in the magnetic layer covering the second corner portion.

Thus, the smooth magnetic path surrounding the wire can be formed in the magnetic layer.

Accordingly, the effective magnetic permeability around the wire can be improved.

As a result, the magnetic wiring circuit board having high inductance can be produced.

Effect of the Invention

The magnetic wiring circuit board of the present invention obtained by the method for producing a magnetic wiring circuit board of the present invention has high inductance.

BRIEF DESCRIPTION OF THE DRAWINGS

FIG. 1 shows a cross-sectional view of one embodiment of a magnetic wiring circuit board of the present invention and a partially enlarged cross-sectional view thereof.

FIGS. 2A to 2D show production process views of the magnetic wiring circuit board shown in FIG. 1:

FIG. 2A illustrating a fourth step of forming a wire base portion (first step),

FIG. 2B illustrating a fifth step of forming a plating layer and forming a wire (first step), FIG. 2C illustrating a second step of forming a second insulating layer, and FIG. 2D illustrating a third step of forming a magnetic layer.

FIG. 4 shows a cross-sectional view of a modified example (embodiment without including a second insulating layer) of the magnetic wiring circuit board shown in FIG. 1.

FIGS. 7A to 7C show partially enlarged cross-sectional views of a magnetic wiring circuit board of Comparative Example 1 (comparative example in which a second corner portion has a vertical surface):

FIG. 7A illustrating an embodiment in which magnetic particles are bent,

FIG. 7B illustrating an embodiment in which a particle-absent portion is produced, and FIG. 7C illustrating an embodiment in which a void is produced.

FIGS. 8B to 8C show partially enlarged cross-sectional views of a magnetic wiring circuit board of comparative example 2 (comparative example in which a second corner portion has a second narrowed portion):

FIG. 8A illustrating an embodiment in which magnetic particles are bent,

FIG. 8B illustrating an embodiment in which a particle-absent portion is produced, and FIG. 8C illustrating an embodiment in which a void is produced.

DESCRIPTION OF EMBODIMENTS

One Embodiment

Figure 3:
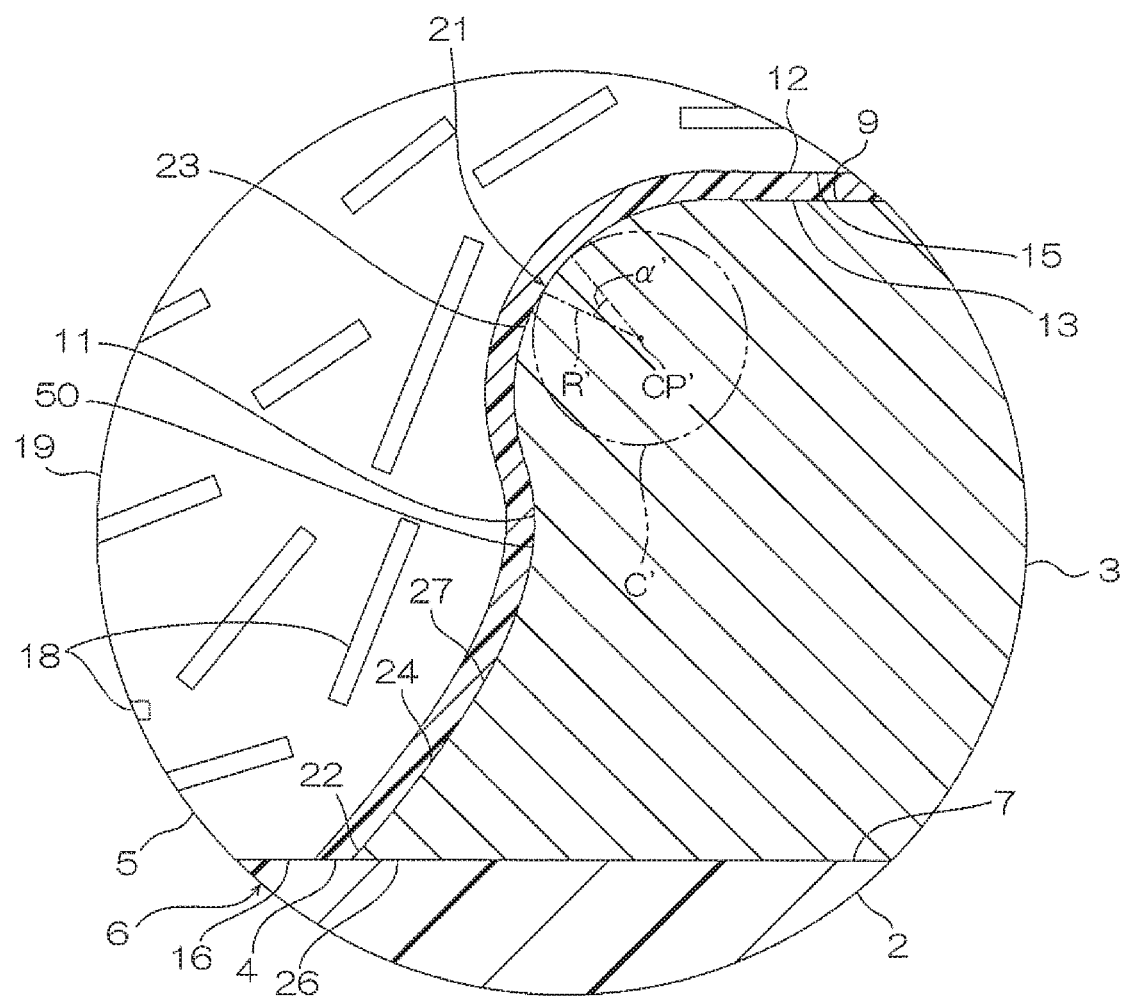
FIG. 3 shows a cross-sectional view for explaining a circle of a circular arc surface passing a curved surface of a first corner portion in FIG. 1.

A magnetic wiring circuit board 1 that is one embodiment of a wiring circuit board of the present invention is described with reference to FIG. 1.

The magnetic wiring circuit board 1 has a one-side surface and an other-side surface in a thickness direction facing each other in the thickness direction, and has a sheet shape extending in a plane direction (direction perpendicular to the thickness direction). The magnetic wiring circuit board 1 includes a first insulating layer 2 that is one example of an insulating layer, a wire portion 3 as one example of a wire, a second insulating layer 4, and a magnetic layer 5.

The first insulating layer 2 has a sheet shape extending in the plane direction. The first insulating layer 2 is a support material that supports the wire portion 3 to be described next, and thus, is also a support layer that supports the magnetic wiring circuit board 1. The first insulating layer 2 has a first insulating surface 7 that is the one-side surface in the thickness direction and a second insulating surface 8 that is the other-side surface in the thickness direction. Each of the first insulating surface 7 and the second insulating surface 8 is a flat surface along the plane direction. The first insulating layer 2 has flexibility.

Examples of a material for the first insulating layer 2 include resins such as polyimide resin, polyester resin, and acrylic resin. The first insulating layer 2 may be either a single layer or a plurality of layers. A thickness of the first insulating layer 2 is not particularly limited, and is, for example, 1 μm or more, and for example, 1000 μm or less.

The plurality of wire portions 3 are, for example, disposed at spaced intervals to each other in a first direction in a cut surface cut along the thickness direction and the first direction (corresponding to a right-left direction in FIG. 1, direction included in the plane direction) on the first insulating surface 7 of the first insulating layer 2. A shape of each of the wire portions 3 when viewed from the top (when viewed in the thickness direction) is not particularly limited, and an example thereof includes a loop shape (coil shape or the like).

The wire portion 3 includes a first wire surface 9 that is the one-side surface in the thickness direction disposed at one side in the thickness direction to face the first insulating surface 7 of the first insulating layer 2 at spaced intervals thereto, a second wire surface 10 that is in contact with the first insulating surface 7 of the first insulating layer 2, and wire side surfaces 11 that are side surfaces each connecting an end edge in the first direction of the first wire surface 9 to that in the first direction of the second wire surface 10.

The first wire surface 9 is a flat surface along the first direction.

The second wire surface 10 is disposed to face the first wire surface 9 in the thickness direction at spaced intervals thereto, and is a flat surface in parallel with the first wire surface 9.

The wire side surfaces 11 extend along the thickness direction. The two wire side surfaces 11 are provided in the one wire portion 3. The two wire side surfaces 11 are disposed to face each other (in opposed relation to each other) at spaced intervals in the first direction.

The wire portion 3 has a first corner portion 21 and a second corner portion 22 as one example of a corner portion.

The first corner portion 21 is a ridge portion (first ridge portion) formed by the first wire surface 9 and the wire side surface 11 in the wire portion 3. To be more specific, the first corner portion 21 is formed over each of both end portions in the first direction of the first wire surface 9 and one end portions in the thickness direction of the wire side surfaces 11 continuous thereto. The two first corner portions 21 are formed in the one wire portion 3.

The first corner portion 21 has a generally curved shape when viewed from the cross-sectional view (cut surface along the thickness direction and the first direction). To be specific, the first corner portion 21 has a curved surface (to be more specific, a generally circular arc surface) 23 expanding outwardly in the first direction and toward one side in the thickness direction.

A center CP of a circle C forming the curved surface 23 (circular arc surface) is, for example, positioned at the inside of the wire portion 3.

A radius (radius of curvature) R of the circle C forming the curved surface 23 is, for example, 5 μm or more, preferably 9 μm or more, more preferably 15 μm or more, further more preferably 20 μm or more, and for example, 30 μm or less. When the radius of curvature R of the curved surface 23 is the above-described lower limit or more, the curved surface 23 can be made gentle, and the second insulating layer 4 to be described next can be furthermore surely formed in a sufficient thickness T. Also, magnetic particles 18 (described later) can be surely orientated along the curved surface 23 in the second insulating layer 4 facing the first corner portion 21.

When the radius of curvature R of the first corner portion 21 is the above-described upper limit or less, the magnetic layer 5 can fill a central portion 50 in the thickness direction (described later) of the wire side surface 11 without a gap (void).

A central angle α of the curved surface 23 is an angle made between a line segment connecting one end of a circular arc to the center CP and a line segment connecting the other end of the circular arc to the center CP, and is, for example, below 180 degrees. To be specific, the central angle α of the curved surface 23 is, for example, 45 degrees or more, preferably 60 degrees or more, more preferably 80 degrees or more, and for example, 150 degrees or less, preferably 135 degrees or less, more preferably 120 degrees or less. When the central angle α of the curved surface 23 is the above-described lower limit or more, a length of the curved surface 23 can be made long, and thus, the magnetic particles 18 can be (be orientated) surely along the curved surface 23. When the central angle α of the curved surface 23 is the above-described upper limit or less, the magnetic layer 5 can fill the central portion 50 in the thickness direction (described later) of the wire side surface 11 without a gap (void).

As shown by an enlarged view of FIG. 1, the circle C forming the curved surface 23 is defined as the circle C based on the center CP by determining the center CP so as to form the circular arc passing (overlapped with) the curved surface 23 at the maximum amount in the first corner portion 21. Meanwhile, as shown in FIG. 3, the circle C is not a circle C' based on a center CP' by determining a center CP' so as to form the circular arc passing (overlapped with) the curved surface 23 slightly (at the minimum amount) in the first corner portion 21.

The second corner portion 22 is a ridge portion (second ridge portion) formed by the second wire surface 10 and the wire side surface 11 in the wire portion 3. To be more specific, the second corner portion 22 is formed over each of both end portions in the first direction of the second wire surface 10 and the other end portions in the thickness direction of the wire side surfaces 11 continuous thereto. The two second corner portions 22 are formed in the one wire portion 3.

Each of the two second corner portions 22 is disposed at the other side in the thickness direction with respect to each of the two first corner portions 21.

The second corner portion 22 is a second pointed portion that is pointed outwardly in the first direction (toward the other side in the first direction obliquely outwardly in the first direction). The second corner portion 22 has (is defined by) an inclined surface 24 and a flat surface 26.

The inclined surface 24 has a tapered surface 27 as a main portion. Preferably, the inclined surface 24 consists of only the tapered surface 27. The inclined surface 24 is continuous from the central portion (to be specific, around between the central portion and the other end portion) 50 in the thickness direction of the wire side surface 11, and faces outwardly in the first direction. The two inclined surfaces 24 corresponding to the two second corner portions 22 are disposed to face each other (in opposed relation to each other) in the first direction.

The tapered surface 27 inclines with respect to the thickness direction and the first direction. That is, the tapered surface 27 inclines with respect to the thickness direction and the first direction, and is along an inclining direction (first inclining direction) (ref: direction arrow shown along with the enlarged view) in which the plane gradually inclines outwardly in the first direction as it goes toward the other side in the thickness direction. The two tapered surfaces 27 corresponding to the two inclined surfaces 24 are two tapered surfaces (one example of a portion) in which a length therebetween becomes longer as it goes toward the other side in the thickness direction. To be specific, the tapered surfaces 27 incline so as to be gradually widened outwardly in the first direction from the central portions (to be specific, around between the central portion and the other end portion) 50 in the thickness direction of the wire side surfaces 11 toward both end edges (the first insulating surface 7 of the first insulating layer 2) in the first direction of the second wire surface 10. A taper ratio (length in the first direction/length in the thickness direction) obtained by dividing the length in the first direction by the length in the thickness direction in the tapered surface 27 is, for example, 0.001 or more, preferably 0.01 or more, more preferably 0.1 or more, and for example, 1.0 or more, preferably 0.75 or less.

The flat surface 26 is a plane extending straight from the other end edge at the other side in the thickness direction of the inclined surface 24 inwardly in the first direction. The flat surface 26 corresponds to both end edges in the first direction of the second wire surface 10. The flat surface 26 is in contact with the first insulating surface 7.

The inclined surface 24 of the second corner portion 22 is, for example, spaced apart from the curved surface 23 of the first corner portion 21 with the central portion 50 in the thickness direction of the wire side surface 11 sandwiched therebetween.

The second corner portion 22 may be the same shape as a second pointed portion 45 (ref: FIG. 2A) in a wire base portion 36 to be described later.

The wire side surface 11 continuously includes a portion facing outwardly in the first direction of the curved surface 23 of the first corner portion 21, the central portion 50 in the thickness direction, and a portion facing outwardly in the first direction of the inclined surface 24 of the second corner portion 22.

Each of the central portions 50 in the thickness direction of the two wire side surfaces 11 has a constricted shape inwardly in the first direction. To be specific, the wire side surfaces 11 have a shape (constricted portion) in which a length therebetween is the shortest in the central portion in the thickness direction.

As shown by a phantom line of FIG. 2B, the wire portion 3 has, for example, the wire base portion 36 and a plating layer 30 that is formed on the one-side surface and both side surfaces in the thickness direction of the wire base portion 36.

Examples of a material for the wire portion 3 include conductors such as metals including copper, nickel, gold, solder, or an alloy thereof. Preferably, copper is used.

A thickness of the wire portion 3 is a length between the first wire surface 9 and the second wire surface 10, and to be specific, is, for example, 10 µm or more, preferably 30 µm or more, and for example, 500 µm or less, preferably 250 µm or less.

A width of the wire portion 3, as a distance between the end edges in the first direction of the two first corner portions 21 facing each other, is, for example, 20 µm or more, preferably 50 µm or more, and for example, 2000 µm or less, preferably 1000 µm or less.

A gap between the wire portions 3 that are next to each other, as a gap between the end edges in the first direction of the first corner portions 21 that are next to each other separated by the second insulating layer 4 (described later) and the magnetic layer 5 (described later), is, for example, 20 µm or more, preferably 50 µm or more, and for example, 1000 µm or less, preferably 500 µm or less. A ratio (thickness/width) of the thickness of the wire portion 3 to the width thereof is, for example, 0.005 or more, preferably 0.03 or more, and for example, 25 or less, preferably 5 or less. A ratio (thickness/gap) of the thickness of the wire portion 3 to the gap between the wire portions 3 that are next to each other is, for example, 0.01 or more, preferably 0.06 or more, and for example, 25 or less, preferably 5 or less. A ratio (width/gap) of the width of the wire portion 3 to the gap between the wire portions 3 that are next to each other is, for example, 0.02 or more, preferably 0.01 or more, and for example, 100 or less, preferably 20 or less.

The wire portion 3, along with the above-described first insulating layer 2, is provided in a wiring circuit board preparation body 6. That is, the wiring circuit board preparation body 6 does not include the second insulating layer 4 and the magnetic layer 5 to be described next, and includes the first insulating layer 2 and the wire portion 3. Preferably, the wiring circuit board preparation body 6 consists of only the first insulating layer 2 and the wire portion 3.

The plurality of second insulating layers 4 are provided corresponding to the plurality of wire portions 3. The second insulating layers 4 are formed in thin film shapes along the first wire surfaces 9 and the wire side surfaces 11 (including the curved surfaces 23 and the inclined surfaces 24) of the wire portions 3. Each of the second insulating layers 4 includes a fourth insulating surface 13 that is in contact with the first wire surface 9 and the wire side surfaces 11, and a third insulating surface 12 that is disposed at one side in the thickness direction or at the outside in the first direction of the fourth insulating surface 13 at spaced intervals thereto.

The fourth insulating surface 13 has a shape corresponding to (to be specific, the same shape as) the first wire surface 9 and the wire side surfaces 11.

The third insulating surface 12 has a shape following the fourth insulating surface 13 so as to ensure the thickness T of the second insulating layer 4. The third insulating surface 12 has a shape in parallel with the fourth insulating surface 13.

The second insulating layer 4 is, for example, an electrodeposition layer (described later) and a coating layer (described later), preferably, an electrodeposition layer.

The second insulating layer 4 is, for example, relatively soft (among all, has properties of becoming soft during thermal pressing in a third step (ref: FIG. 2D) to be described later), and does not have magnetic properties. To be specific, an example of a material for the second insulating layer 4 includes a resin that does not contain the magnetic particles 18 (details are described in the magnetic layer 5 later). The resin of the second insulating layer 4 is preferably a resin having ionicity in water. To be specific, examples thereof include acrylic resin, epoxy resin, polyimide resin, or a mixture thereof.

The thickness T of the second insulating layer 4 is relatively thin, and an average thickness thereof is, for example, 20 µm or less, preferably 15 µm or less, more preferably 10 µm or less, further more preferably 7.5 µm or less, particularly preferably 5 µm or less, most preferably 3 µm or less, and for example, 0.1 µm or more, preferably 0.5 µm or more, more preferably 1 µm or more.

When the thickness T of the second insulating layer 4 is thin of the above-described upper limit or less, an effective magnetic permeability of the magnetic layer 5 to be described next is improved, and inductance of the magnetic wiring circuit board 1 can be made high.

Meanwhile, when the second insulating layer 4 is excessively thin, the magnetic particles 18 in the magnetic layer 5 to be described later pass through the second insulating layer 4 to be easily brought into contact with the wire portion 3.

In the magnetic wiring circuit board 1, however, the first corner portion 21 of the wire portion 3 has a generally curved shape, so that the thickness T of the second insulating layer 4 suppresses excessive thinning thereof, suppresses passing through the second insulating layer 4 by the magnetic particles 18, and thus, insulating properties of the second insulating layer 4 can be ensured.

A thickness T1 of a portion covering the first corner portion 21 in the second insulating layer 4 is the same as, or is allowed to be slightly smaller than a thickness T0 of a portion covering a portion other than the first corner portion 21 in the second insulating layer 4 described above (for example, the central portion 50 in the thickness direction of the wire side surface 11 and/or the central portion in the first direction of the first wire surface 9).

A ratio (T1/T0) of the thickness T1 of the portion covering the first corner portion 21 to the thickness T0 of the portion covering the portion other than the first corner portion 21 in the second insulating layer 4 is, for example, 1 or less, preferably below 1, more preferably 0.95 or less, further more preferably 0.9 or less, and for example, 0.7 or more, preferably 0.8 or more.

The thickness T1 of the portion covering the first corner portion 21 in the second insulating layer 4 is, for example, 0.5 µm or more, preferably 1 µm or more, and for example, 10 µm or less, preferably 7 µm or less.

The thickness T0 of the portion covering the other portion in the second insulating layer 4 is, for example, 0.52 µm or more, preferably 1.04 µm or more, and for example, 14.49 µm or less, preferably 10.14 µm or less.

An average thickness of the second insulating layer 4 is calculated by dividing the above-described thickness T1 and T0 proportionately by an area ratio thereof.

The magnetic layer 5 is provided with respect to the wiring circuit board preparation body 6 to improve the inductance of the magnetic wiring circuit board 1. The magnetic layer 5 has a sheet shape extending in the plane direction.

The magnetic layer 5 embeds the wire portion 3 via the second insulating layer 4. To be specific, the magnetic layer 5 covers the first wire surface 9 and the wire side surface 11 (including the curved surface 23 and the inclined surface 24) of the wire portion 3 via the second insulating layer 4. The magnetic layer 5 covers an exposed surface 16 that is exposed from the second insulating layer 4 on the first insulating surface 7 of the first insulating layer 2.

The magnetic layer 5 has a first magnetic surface 14 and a second magnetic surface 15.

The first magnetic surface 14 is disposed at one side in the thickness direction of the third insulating surface 12 of the second insulating layer 4 at spaced intervals thereto. The first magnetic surface 14 is exposed toward one side in the thickness direction. The first magnetic surface 14 has a plurality of protruding portions 28 that protrude toward one side in the thickness direction corresponding to the plurality of wire portions 3, and a recessed portion 29 that is disposed between the protruding portions 28 that are next to each other and sinks toward the other side in the thickness direction with respect to the protruding portions 28.

The second magnetic surface 15 is disposed at the other side in the thickness direction of the first magnetic surface 14 at spaced intervals thereto. The second magnetic surface 15 is continuously in contact with the third insulating surface 12 and the exposed surface 16.

The magnetic layer 5 contains, for example, the magnetic particles 18. To be specific, an example of a material for the magnetic layer 5 includes a magnetic composition containing the magnetic particles 18 having an aspect ratio of 2 or more and a resin component 19.

Examples of the magnetic particles 18 include soft magnetic particles 18 such as Sendust. Examples of a shape of the magnetic particles 18 include flat shape (platy) having a thin thickness and wide plane and needle shape.

An aspect ratio of the magnetic particles 18 is 2 or more, preferably 5 or more, more preferably 10 or more, further more preferably 20 or more, and 100 or less.

When the magnetic particles 18 are shaped flat, a flat ratio (flat degree) thereof is, for example, 8 or more, preferably 15 or more, and for example, 500 or less, preferably 450 or less. The flat ratio is, for example, an aspect ratio obtained by dividing an average particle size (average length) of the magnetic particles 18 by an average thickness of the magnetic particles 18.

A content ratio of the magnetic particles 18 in the magnetic layer 5 (magnetic composition) is, for example, 50% by volume or more, preferably 55% by volume or more, and for example, 95% by volume or less, preferably 90% by volume or less.

Examples of the resin component 19 include thermosetting resins such as epoxy resin composition containing an epoxy resin, a curing agent, and a curing accelerator. The magnetic composition is, for example, described in Japanese Unexamined Patent Publications No. 2017-005115 and 2015-092543.

The magnetic wiring circuit board 1 has a thickness, as the maximum thickness (thickness corresponding to the protruding portion 28), of, for example, 30 µm or more, preferably 50 µm or more, and for example, 1000 µm or less, preferably 800 µm or less.

Next, a method for producing the magnetic wiring circuit board 1 is described with reference to FIGS. 2A to 2D.

The producing method includes a first step (ref: FIGS. 2A and 2B) as one example of a step of preparing the first insulating layer 2 and the wire portion 3, a second step (ref: FIG. 2C) of forming the second insulating layer 4, and a third step (ref FIG. 2D) as one example of a step of forming the magnetic layer 5.

As shown in FIGS. 2A and 2B, in the first step, the wiring circuit board preparation body 6 including the first insulating layer 2 and the wire portion 3 is prepared. The first step includes a step (ref: FIG. 2A) of preparing the first insulating layer 2, a fourth step (ref: FIG. 2A) of forming the wire base portion 36, and a fifth step (ref: FIG. 2B) of forming the plating layer 30.

In the fourth step, the wire base portion 36 is, for example, formed on the first insulating surface 7 of the first insulating layer 2 by a conductor patterning method such as subtractive method and additive method.

To form the wire base portion 36 by the subtractive method, first, a laminate (not shown) consisting of the first insulating layer 2 and a conductive layer (metal layer) is prepared, and subsequently, an etching resist is formed on the one-side surface in the thickness direction of the conductive layer in the same pattern as that of the wire base portion 36. Next, the conductive layer exposed from the etching resist is, for example, subjected to patterning by etching such as wet etching and dry etching, thereby forming the wire base portion 36. Preferably, the wire base portion 36 is formed by wet etching. Thereafter, the etching resist is, for example, removed by peeling or the like.

To form the wire base portion 36 by the additive method, first, a conductor thin film (seed film) is formed on the first insulating surface 7 of the first insulating layer 2, and subsequently, a plating resist having a pattern reverse to that of the wire base portion 36 is formed on the one-side surface in the thickness direction of the conductor thin film. Next, the wire base portion 36 is formed on the conductor thin film exposed from the plating resist by plating. Thereafter, the plating resist, and the conductor thin film corresponding thereto are removed.

As the conductor patterning method, preferably, a subtractive method is used. In the subtractive method, the wire base portion 36 having a thick thickness can be quickly formed compared to the additive method.

Meanwhile, when the wire base portion 36 is formed by the subtractive method, a first pointed portion 25 is formed in the wire base portion 36. As described later, thinning of the second insulating layer 4 caused by the first pointed portion 25 can be resolved by the plating layer 30 formed in the fifth step to be described later.

The wire base portion 36 is a base portion (foundation) for forming the wire portion 3, and along with the plating layer 30 to be described later, forms the wire portion 3. That is, the wire portion 3 does not consist of only the wire base portion 36 shown in FIG. 2A.

The wire base portion 36 has the first pointed portion 25 corresponding to the first corner portion 21, a base central side surface 51 corresponding to the central portion 50 in the thickness direction, and a second pointed portion 45 corresponding to the second corner portion 22.

The first pointed portion 25 is a ridge portion formed by the one-side surface and the side surface in the thickness direction of the wire base portion 36. The first pointed portion 25 is sharply pointed toward one side in the first direction obliquely outwardly in the first direction. An angle (angle formed between the end portion of the first wire surface 9 and that of the wire side surface 11) β1 of the first pointed portion 25 is, for example, 135 degrees or less, preferably 120 degrees or less, more preferably 90 degrees or less, and for example, 30 degrees or more, preferably 45 degrees or more.

The second pointed portion 45 is a ridge portion formed by the other-side surface and the side surface in the thickness direction of the wire base portion 36. The second pointed portion 45 is sharply pointed toward the other side in the first direction obliquely outwardly in the first direction. An angle (angle formed between the end portion of the second wire surface 10 and that of the wire side surface 11) β2 of the second pointed portion 45 is, for example, 35 degrees or more, preferably 45 degrees or more, more preferably above 80 degrees, and for example, 150 degrees or less, preferably 135 degrees or less.

The base central side surface 51 is a connecting surface that connects the first pointed portion 25 to the second pointed portion 45 in the thickness direction.

A material for the wire base portion 36 is the same as that for the wire portion 3 described above.

As shown in FIG. 2B, in the fifth step, thereafter, the plating layer 30 is formed on the wire base portion 36.

A material for the plating layer 30 is appropriately selected from the material for the wire base portion 36. Preferably, the material for the plating layer 30 is the same as that for the wire base portion 36.

The plating layer 30 is formed by the plating.

Examples of the plating include electrolytic plating and electroless plating. Preferably, in view of forming the plating layer 30 thick, electrolytic plating (more preferably, electrolytic copper plating) is used.

The plating layer 30 is laminated on the one-side surface and both side surfaces in the thickness direction of the wire base portion 36 by the plating. In the plating, the plating layer 30 is formed in a precipitation state on the one-side surface and both side surfaces in the thickness direction of the wire base portion 36.

By the plating, as one example of a cover portion, a first cover portion 31 growing (subjected to growth of plating) toward one side in the thickness direction and outwardly in the first direction is precipitated in the first pointed portion 25. The first cover portion 31 forms the first corner portion 21 having the curved surface 23.

Meanwhile, in a portion other than the first pointed portion 25 in the wire base portion 36 (portion including the second pointed portion 45 and the central portion 50 in the thickness direction), a second cover portion 32 growing (subjected to growth of plating) toward one side in the thickness direction or outwardly in the first direction is precipitated. The second cover portion 32 forms the one-side surface and both side surfaces (portion excluding the first corner portion 21 and including the central portion 50 in the thickness direction and the inclined surface 24) in the thickness direction of the wire base portion 36.

That is, the plating layer 30 includes the first cover portion 31 and the second cover portion 32. Preferably, the plating layer 30 consists of only the first cover portion 31 and the second cover portion 32.

The first cover portion 31 is formed by the growth of plating of a plating component from the first pointed portion 25 in a generally radial shape (excluding an inward direction of the first pointed portion 25, fan shape) when viewed from the cross-sectional view. Thus, the first cover portion 31 has the curved surface 23.

Meanwhile, the second cover portion 32 is formed, in a portion other than the first pointed portion 25 in a direction perpendicular to each surface, to be specific, on the one-side surface in the thickness direction of the wire base portion 36, by the growth of plating of the plating component planarity upwardly in the thickness direction, and on both side surfaces (including the side surfaces of the second pointed portion 45) of the wire base portion 36, by the growth of plating of the plating component planarity toward both outwardly in the first direction. Thus, the second cover portion 32 does not have the above-described curved surface 23, and has the first wire surface 9 and the wire side surface 11 (including the central portion 50 in the thickness direction and excluding the curved surface 23).

The second cover portion 32 includes the second corner portion 22, and the second corner portion 22 includes the inclined surface 24 based on the above-described growth of plating.

In the plating layer 30, a thickness (growing thickness or plating thickness) of the first cover portion 31 is preferably thicker than that of the second cover portion 32. In the case of the electrolytic plating, the current density of the first pointed portion 25 is higher than that of a portion other than the first pointed portion 25 in the wire base portion 36. Thus, the growth of plating of the first cover portion 31 is faster than that of the second cover portion 32, and therefore, the thickness of the first cover portion 31 is thicker than that of the second cover portion 32.

A thickness of the plating layer 30 is appropriately set in accordance with a growing rate of the plating and plating time. These are appropriately set in accordance with, for example, the metal (conductor) concentration, a temperature, or the like of a plating solution used in the plating; for example, the current density, a distance between electrodes, a degree (rate) of stirring in bath, the concentration of copper sulfate, the concentration of sulfuric acid, the concentration of chloride ion, and a kind and amount of additives (leveler, brightener, polymer) in the case of the electrolytic plating; and for example, a kind, an amount, or the like of a catalyst attached to the surface of the wire base portion 36 in e case of the electroless plating.

As shown in FIG. 2B, a boundary shown by the phantom line is represented between the wire base portion 36 and the plating layer 30. When the material for the plating layer 30 described above is the same as that for the wire base portion 36, the above-described boundary is unclear or does not exist (is not observed).

In the plating layer 30, the first cover portion 31 is formed by the above-described plating, so that the above-described curved surface 23 is provided. Meanwhile, the second cover portion 32 has the inclined surface 24.

As shown in FIG. 2C, in the second step, subsequently, the second insulating layer 4 is formed in the above-described wiring circuit board preparation body 6. To be specific, the second insulating layer 4 covers the first wire surface 9 and the wire side surface 11 of the wire portion 3.

Examples of a method for forming the second insulating layer 4 include electrodeposition (electrodeposition coating) and application such as printing.

In the electrodeposition, the wiring circuit board preparation body 6 (the magnetic wiring circuit board 1 in the process of production) is immersed in an electrodeposition liquid containing a resin (preferably, electrodeposition paint), and subsequently, an electric current is applied to the wire portion 3, so that a coating film of the resin is precipitated into the first wire surface 9 and the wire side surface 11 of the wire portion 3. Thereafter, the coating film is dried as needed. In this manner, the second insulating layer 4 is formed as an electrodeposition layer. Thereafter, the second insulating layer 4 (electrodeposition layer) is heated and cured by baking as needed.

In the printing that is one example of the application, a varnish containing a resin is applied to the first wire surface 9 and the wire side surface 11 of the wire portion 3 via a screen (screen printing), thereby forming a coating film. Thereafter, the coating film is dried.

As the method for forming the second insulating layer 4, preferably, electrodeposition is used. In the case of the electrodeposition, the thickness T of the second insulating layer 4 can be made thin (set at such a degree as to ensure insulating properties of the second insulating layer 4). In the case of the electrodeposition, the second insulating layer 4 can surely expose the exposed surface 16, and thus, the magnetic layer 5 can be disposed over the entire thickness direction between the wire portions 3 that are next to each other in the next third step, so that the effective magnetic permeability of the magnetic layer 5 is improved, and the inductance of the magnetic wiring circuit board 1 is high.

As shown in FIG. 2D, in the third step, thereafter, the magnetic layer 5 is formed in the wiring circuit board preparation body 6. To be specific, the magnetic layer 5 covers the first wire surface 9 and the wire side surface 11 of the wire portion 3 via the second insulating layer 4.

As shown in FIG. 2C, in the third step, for example, a magnetic sheet 17 is first prepared. To prepare the magnetic sheet 17, for example, a magnetic composition containing the above-described magnetic particles and the above-described resin component (preferably, a thermosetting resin in a B-stage state) is formed into a sheet shape. In the magnetic sheet 17, the magnetic particles 18 are orientated (arranged) in the plane direction (direction perpendicular to the thickness direction) of the magnetic sheet 17.

Thereafter, as shown by arrows of FIG. 2C, the magnetic sheet 17 is thermally pressed toward the second insulating layer 4 of the wiring circuit board preparation body 6. The magnetic sheet 17 is disposed at one side in the thickness direction of the wiring circuit board preparation body 6, and thermally pressed toward the one-side surface in the thickness direction of the wiring circuit board preparation body 6.

In this manner, the magnetic sheet 17 embeds the wire portion 3 via the second insulating layer 4. To be specific, the magnetic sheet 17 covers the first wire surface 9 of the second insulating layer 4 via the second insulating layer 4, and enters (sinks into) a space between the wire portions 3 that are next to each other (portion facing the exposed surface 16) to fill the space (portion).

In the magnetic sheet 17 before or after the thermal pressing, an orientation direction (to be specific, the plane direction) of the magnetic particles 18 facing the first wire surface 9 of the wire portion 3 does not change. Also, in the magnetic sheet 17 before or after the thermal pressing, the orientation direction (to be specific, the plane direction) of the magnetic particles 18 facing the exposed surface 16 does not change.

Meanwhile, in the magnetic sheet 17 before or after the thermal pressing, the orientation direction (to be specific, the plane direction) of the magnetic particles 18 facing the first corner portion 21 changes into a direction along the curved surface 23 (that is, a diagonal direction in which the plane inclines outwardly in the first direction as it goes toward the other side in the thickness direction). That is, the above-described magnetic particles 18 are orientated along the curved surface 23.

In the magnetic sheet 17 before or after the thermal pressing, the orientation direction (to be specific, the plane direction) of the magnetic particles 18 facing the second corner portion 22 changes into a direction along the inclined surface 24 (that is, the diagonal direction in which the plane inclines outwardly in the first direction as it goes toward the other side in the thickness direction). That is, the above-described magnetic particles 18 are orientated along the inclined surface 24.

Meanwhile, in the magnetic sheet 17 before or after the thermal pressing, the orientation direction (to be specific, the plane direction) of the magnetic particles 18 facing a space between the first corner portion 21 and the second corner portion 22 in the wire side surface 11 changes into a direction along the thickness direction. That is, the above-described magnetic particles 18 are orientated along the thickness direction.

In this manner, the magnetic sheet 17 covers the wire portion 3 via the second insulating layer 4 to be formed (molded) as the magnetic layer 5 having the protruding portion 28 and the recessed portion 29.

The magnetic particles 18 orientated in the magnetic layer 5 as described above form a smooth magnetic path surrounding the wire portion 3.

In this manner, the magnetic wiring circuit board 1 including the wiring circuit board preparation body 6 and the magnetic layer 5 is obtained. Preferably, the magnetic wiring circuit hoard 1 consists of only the wiring circuit board preparation body 6 and the magnetic layer 5.

Thereafter, when the magnetic layer 5 contains the thermosetting resin in a B-stage state, the magnetic layer 5 is, for example, brought into a C-stage state (completely cured) by heating as needed.

The magnetic wiring circuit board 1 is, for example, used for wireless power transmission (wireless power feeding and/or wireless power receiving), wireless communication, censors, passive components, or the like. In the magnetic wiring circuit board 1, the first corner portion 21 of the wire portion 3 has the generally curved shape, so that the magnetic particles 18 can be orientated along the curved shape of the first corner portion 21 in the magnetic layer 5 covering the first corner portion 21.

In the magnetic wiring circuit board 1, the second corner portion 22 has the tapered surface 27 in which the length between the two wire side surfaces 11 facing each other becomes longer as it goes toward the second wire surface 10, so that the magnetic particles 18 can be orientated along the second corner portion 22 in the magnetic layer 5 covering the second corner portion 22.

In contrast, as shown in FIG. 7, in comparative example 1 where the second corner portion 22 has a vertical surface 33 that is formed vertically and as shown in FIG. 8, in comparative example 2 where the second corner portion 22 has a second tapered portion (second narrowed portion) 34 in which the plane is narrowed (tapered) inwardly in the first direction as it goes toward the first insulating surface 7, as shown in FIGS. 7A and 8A, the magnetic particles 18 are damaged (bent) in the magnetic layer 5; as shown in FIGS. 7B and 8B, a panicle-absent portion 55 in which the magnetic particles 18 do not exist is produced; and furthermore, as shown in FIGS. 7C and 8C, a void 56 (portion in which the magnetic particles 18 and the resin component 19 do not exist) is produced in the magnetic layer 5.

As shown in FIG. 1, however, in the magnetic wiring circuit board 1, the magnetic particles 18 are orientated in the first direction included in the plane direction in the magnetic layer 5 covering the first wire surface 9 of the wire portion 3; are orientated in the thickness direction in the magnetic layer 5 covering the wire side surface 11 of the wire portion 3; are orientated in the first inclining direction in the magnetic layer 5 covering the first corner portion 21; and are orientated in the first inclining direction in the magnetic layer 5 covering the second corner portion 22. The above-described damage of the magnetic particles 18, production of the particle-absent portion 55, and production of the void 56 can be suppressed.

Thus, the smooth magnetic path surrounding the wire portion 3 can be formed in the magnetic layer 5.

Accordingly, the effective magnetic permeability around the wire portion 3 can be improved.

As a result, the magnetic wiring circuit board I has high inductance.

In the magnetic wiring circuit board 1, the radius of curvature R of the first corner portion 21 is 9 μm or more, so that the first corner portion 21 has the curved surface 23 that is a gentle circular arc surface. Thus, the magnetic panicles 18 can be furthermore surely orientated along the curved surface 23 (circular arc surface) in the magnetic layer 5 facing the first corner portion 21.

According to the method for producing the magnetic wiring circuit board 1, in the third step of forming the magnetic layer 5, the magnetic sheet containing the magnetic particles 18 orientated in the plane direction is thermally pressed toward the wire portion 3, so that the magnetic particles 18 can be orientated in the first direction included in the plane direction in the magnetic layer 5 covering the first wire surface 9 of the wire portion 3; can be orientated in the thickness direction in the magnetic layer 5 covering the wire side surface 11 of the wire portion 3; can be orientated in the first inclining direction in the magnetic layer 5 covering the first corner portion 21; and can be orientated in the first inclining direction in the magnetic layer 5 covering the second corner portion 22.

Thus, the smooth magnetic path surrounding the wire portion 3 can be formed in the magnetic layer 5.

Accordingly, the effective magnetic permeability around the wire portion 3 can improved.

As a result, the magnetic wiring circuit board I having high inductance can be produced,

MODIFIED EXAMPLES

In the following modified examples, the same reference numerals are provided for members and steps corresponding to each of those in the above-described one embodiment, and their detailed description is omitted. Each of the modified examples can achieve the same function and effect as that of one embodiment unless otherwise specified. Furthermore, one embodiment and the modified examples thereof can be appropriately used in combination.

As shown in FIG. 1, in one embodiment, the magnetic wiring circuit board 1 includes the second insulating layer 4. Alternatively, for example, as shown in FIG. 4, the magnetic wiring circuit board 1 can also include the first insulating layer 2, the wire portion 3, and the magnetic layer 5 without including the second insulating layer 4, in the modified example, preferably, the magnetic wiring circuit board 1 consists of only the first insulating layer 2, the wire portion 3, and the magnetic layer 5.

In the modified example, a wiring circuit board 6 includes the first insulating layer 2 and the wire portion 3 without including the second insulating layer 4. Preferably, the wiring circuit board 6 consists of only the first insulating layer 2 and the wire portion 3.

The magnetic layer 5 directly embeds the wire portion 3. That is, the second magnetic surface 15 of the magnetic layer 5 is in direct contact with the first wire surface 9 of the wire portion 3 without sandwiching the second insulating layer 4 (ref: FIG. 1) therebetween.

Figure 5:
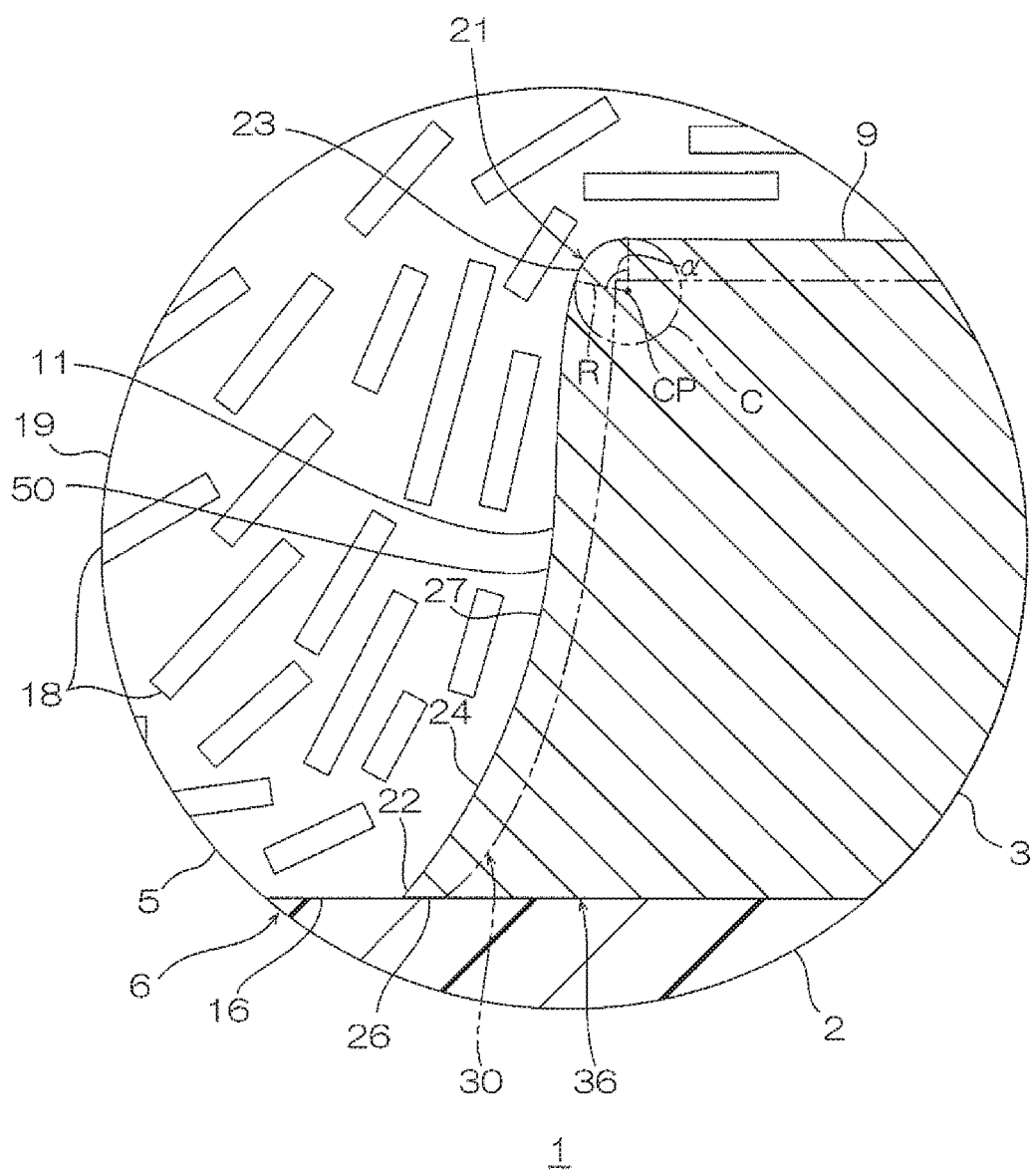
FIG. 5 shows a partially enlarged cross-sectional view of a modified example (embodiment in which a plating layer is thin, and a wire side surface does not have a constricted portion) of the magnetic wiring circuit board shown in FIG. 1.

As shown in FIG. 1, in one embodiment, the one wire portion 3 has a constricted portion in which a length between the two wire side surfaces 11 is the shortest in the central portion in the first direction. Alternatively, as shown in FIG. 5, the wire portion 3 can also have the wire side surface 11 without including the constricted portion.

FIG. 1 in one embodiment shows one example in which the plating layer 30 is relatively thick. As shown in FIG. 5, the modified example is an example in which the thickness of the plating layer 30 is thinner than that of one embodiment.

In the modified example, the radius of curvature R of the circle C forming the curved surface 23 is relatively small, and the central angle $\alpha$ is also small. The radius of curvature R is, for example, below 9 μm, furthermore 5 μm or less, furthermore 2 μm or less, and the central angle $\alpha$ is below 110 degrees.

Figure 6:
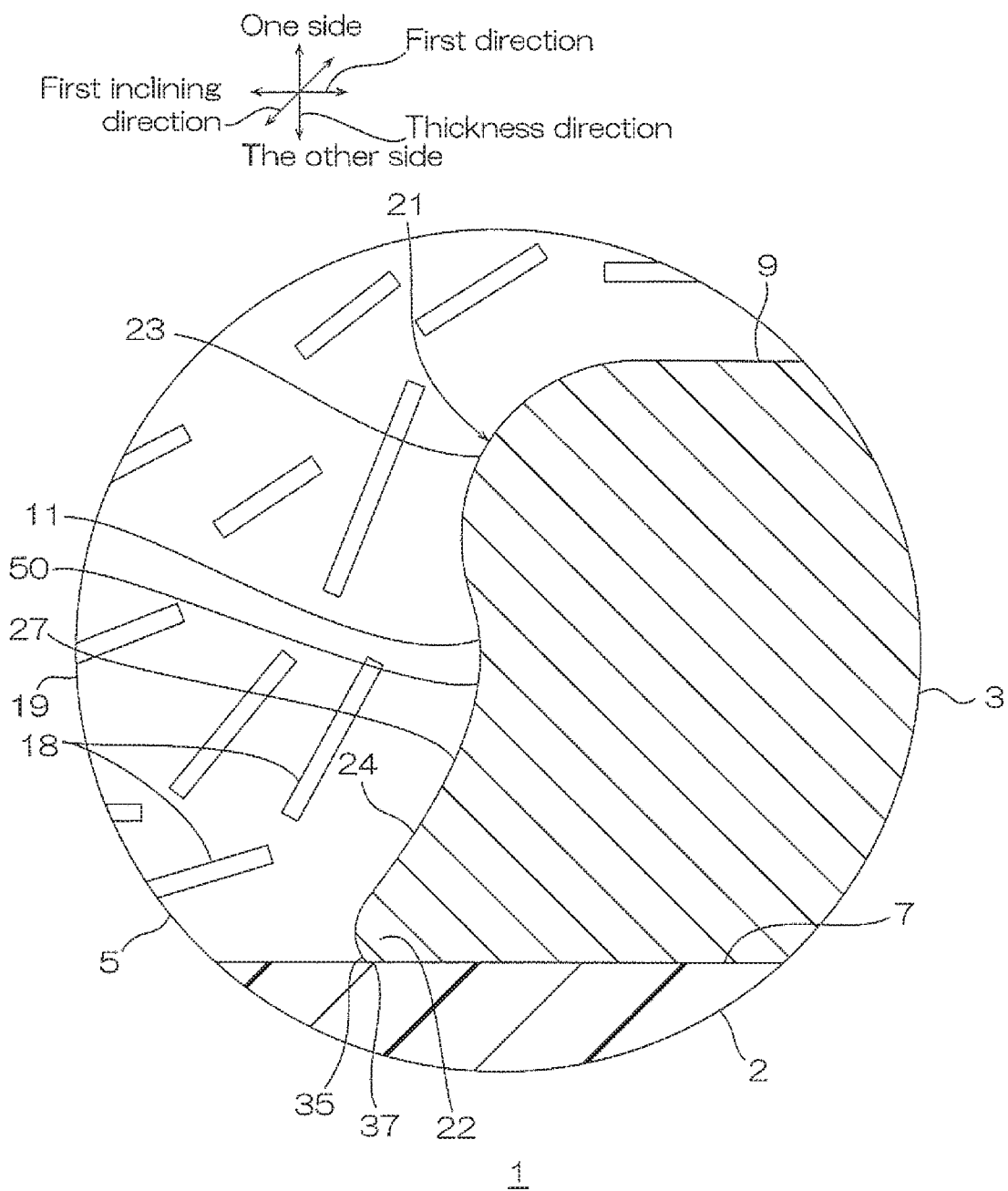
FIG. 6 shows a partially enlarged cross-sectional view of a modified example (embodiment in which a second corner portion has a second narrowed portion) of the magnetic wiring circuit board shown in FIG. 1.

As shown in FIG. 1, in one embodiment, the inclined surface 24 consists of only the tapered surface 27, As shown in FIG. 6, however, for example, the other end edge in the thickness direction of the inclined surface 24 may be a second curved surface 35. The second curved surfaces 35 that are next to each other are a narrowed portion 37 in which a length therebetween becomes shorter as it goes toward the first insulating surface 7.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The magnetic wiring circuit board of the present invention is used for wireless communication and wireless power transmission.

DESCRIPTION OF REFERENCE NUMBER

1 Magnetic wiring circuit board
2 First insulating layer
3 Wire portion
5 Magnetic layer
7 First insulating surface
9 First wire surface
10 Second wire surface 11 Wire side surface
17 Magnetic sheet
21 First corner portion
22 Second corner portion
27 Tapered portion

The invention claimed is:

1. A magnetic wiring circuit board comprising:
an insulating layer having at least a one-side surface;
a wire disposed on the one-side surface in a thickness direction of the insulating layer and having a one-side surface in the thickness direction disposed to face the one-side surface in the thickness direction of the insulating layer at spaced intervals thereto, an other-side surface in the thickness direction in contact with the one-side surface in the thickness direction of the insulating layer, and inclined side surfaces each connecting an end edge of the one-side surface in the thickness direction to an end edge of the other-side surface in the thickness direction; and
a magnetic layer containing at least one magnetic particle having a shape of an aspect ratio of 2 or more and embedding the wire,
wherein the wire embedded in the magnetic layer has
a first corner portion formed by the one-side surface and the side surface in the thickness direction and having a generally curved shape, and
a second corner portion formed by the other-side surface and the side surface in the thickness direction and having a portion in which a length between the two inclined side surfaces facing each other becomes longer as it goes toward the other-side surface in the thickness direction.

2. The magnetic wiring circuit board according to claim 1, wherein a radius of curvature R of the first corner portion is 9 μm or more.

3. The magnetic wiring circuit board according to claim 1, wherein the insulating layer is a base insulating layer.

4. The magnetic wiring circuit board according to claim 3, further comprising a further insulating layer which covers a portion of the wire that is exposed from the base insulating layer, the further insulating layer being disposed between the magnetic layer and the wire, such that the magnetic layer embeds the wire via the further insulating layer.

5. The magnetic wiring circuit board according to claim 4, wherein the further insulating layer is formed of a material that does not have magnetic properties.

6. The magnetic wiring circuit board according to claim 5, wherein the material is formed of at least one of acrylic resin, epoxy resin, or polyimide resin.

7. The magnetic wiring circuit board according to claim 4, wherein the radius of curvature R of the first corner portion is 5 μm or more.

8. The magnetic wiring circuit board according to claim 7, wherein the curved shape of the corner portion is a curved surface, and
wherein on condition that the radius of curvature R of the first corner portion is 5 μm or more, the at least one magnetic particle is oriented along the curved surface of the first corner portion in the further insulating layer facing the first corner portion.

9. The magnetic wiring circuit board according to claim 4, wherein on condition that the radius of curvature R of the first corner portion is 30 μm or less, the magnetic layer fills a central portion in the thickness direction of the inclined side surfaces without a gap.

10. The magnetic wiring circuit board according to claim 4, wherein the curved shape of the corner portion is a curved surface, and
wherein a central angle of the curved surface of the first corner portion is 45 degrees or more, the at least one magnetic particle is oriented along the curved surface.

11. The magnetic wiring circuit board according to claim 10, wherein a central angle of a curved surface of the first corner portion is 150 degrees or less, the magnetic layer fills a central portion in the thickness direction of the inclined side surfaces without a gap.

12. The magnetic wiring circuit board according to claim 1, wherein each of the inclined side surfaces includes a tapered surface as a main portion.

13. The magnetic wiring circuit board according to claim 10, wherein the tapered surface inclines with respect to the thickness direction and a first direction including at least a plane direction.

14. The magnetic wiring circuit board according to claim 11, wherein a taper ratio is obtained by dividing a length in at least the first direction by the length in the thickness direction, and wherein the taper ratio is 0.001 or more.

15. The magnetic wiring circuit board according to claim 1, wherein the insulating layer includes an other-side surface devoid of a wire or a magnetic layer.

16. A method for producing a magnetic wiring circuit board comprising the steps of:
preparing an insulating layer; and disposing a wire on a one-side surface in a thickness direction of the insulating layer and having a one-side surface in the thickness direction disposed to face the one-side surface in the thickness direction of the insulating layer at spaced intervals thereto, an other-side surface in the thickness direction in contact with the one-side surface in the thickness direction of the insulating layer, and inclined side surfaces each connecting an end edge of the one-side surface in the thickness direction to an end edge of the other-side surface in the thickness direction; and
forming a magnetic layer so as to contain at least one magnetic particle having a shape of an aspect ratio of 2 or more and embedding the wire,
wherein the embedded wire has
a first corner portion formed by the one-side surface and the side surface in the thickness direction and having a generally curved shape, and
a second corner portion formed by the other-side surface and the side surface in the thickness direction and having a portion in which a length between the two inclined side surfaces facing each other becomes longer as it goes toward the other-side surface in the thickness direction; and
in the step of forming the magnetic layer, thermally pressing a magnetic sheet containing the magnetic particle orientated in a direction perpendicular to the thickness direction wherein the magnetic sheet is thermally pressed with respect to the wire.

* * * * *